(12) United States Patent
Glenn et al.

(10) Patent No.: US 7,335,954 B2
(45) Date of Patent: Feb. 26, 2008

(54) ELECTROSTATIC DISCHARGE PROTECTION DEVICE

(75) Inventors: Jack L. Glenn, Kokomo, IN (US); Pedro E. Castillo-Borelly, Kokomo, IN (US)

(73) Assignee: Delphi Technolgoies, Inc., Troy, MI (US)

( * ) Notice: Subject to any disclaimer, the term of this patent is extended or adjusted under 35 U.S.C. 154(b) by 477 days.

(21) Appl. No.: 11/110,315

(22) Filed: Apr. 20, 2005

(65) Prior Publication Data

US 2006/0237792 A1    Oct. 26, 2006

(51) Int. Cl.
*H01L 23/62* (2006.01)
(52) U.S. Cl. ...................... 257/355; 257/356
(58) Field of Classification Search ............. 257/173, 257/355, 356

See application file for complete search history.

(56) References Cited

U.S. PATENT DOCUMENTS

| 5,682,047 A | 10/1997 | Consiglio et al. |
| 6,521,487 B1 | 2/2003 | Chen et al. |
| 6,555,878 B2 | 4/2003 | Song et al. |
| 2001/0019138 A1 | 9/2001 | Czech et al. |
| 2004/0046181 A1 | 3/2004 | Peters |

*Primary Examiner*—Thien F Tran
(74) *Attorney, Agent, or Firm*—Jimmy L. Funke

(57) ABSTRACT

An electrostatic discharge (ESD) protection device includes a first-type substrate, a second-type well formed in the substrate and a first-type well formed in the substrate. The second-type well includes a second-type+ region formed between first and second first-type+ regions. The first-type well is formed in the substrate adjacent a first side of the second-type well. The first-type well includes first and second first-type regions with a first-type+ region and a second-type+ region formed between the first and second first-type regions. The second-type+ region of the first-type well is formed between the first-type+ region of the first-type well and the second-type well.

14 Claims, 4 Drawing Sheets

ELECTROSTATIC DISCHARGE PROTECTION DEVICE

TECHNICAL FIELD

The present invention is generally directed to a protection device and, more specifically, an electrostatic discharge protection device.

BACKGROUND OF THE INVENTION

Traditionally, a number of devices have been utilized to protect semiconductor devices from high voltages, such as those that occur during electrostatic discharge (ESD). For example, conventional thyristors have been utilized to protect semiconductor devices from high voltages that result from ESD. In general, the conventional thyristor is a four-layer or four-diffusion semiconductor device, with alternating N-type and P-type layers or diffusions, e.g., NPNP or PNPN. The main terminals (i.e., anode and cathode) of a thyristor are across all four layers or diffusions and a control terminal (i.e., gate) is attached to one of the middle layers or diffusions. The operation of a thyristor can generally be understood in terms of a pair of coupled transistors (i.e., an NPN transistor and a PNP transistor), arranged to cause a self-latching action.

One shortcoming of a conventional thyristor is that, like a diode, it only conducts in one direction. Another drawback associated with a conventional thyristor is that it is not a fully controllable switch, in the sense that the triggering current direction needs to be reversed to switch the thyristor off. Yet another shortcoming of a conventional thyristor is that it is not readily integrated with a semiconductor device that is to be protected.

What is needed is a protection device that can be readily integrated with a semiconductor device that is to be protected from electrostatic discharge.

SUMMARY OF THE INVENTION

According to an embodiment of the present invention, an electrostatic discharge (ESD) protection device includes a first-type substrate, a second-type well formed in the substrate and a first first-type well formed in the substrate. The second-type well includes a second-type+ region formed between a first and second first-type+ region. The first first-type well is formed in the substrate adjacent the second-type well. The first first-type well includes first and second first-type regions with a first-type+ region and a second-type + region formed between the first and second first-type regions. The second+ region of the first first-type well is formed between the first-type+ region of the first first-type well and the second-type well.

According to another aspect, the second-type well and the first first-type well are one of abutted, overlapped and spaced apart from one another. According to another embodiment, a second first-type well is also formed in the substrate adjacent the second-type well opposite the first first-type well. The first-type well includes first and second first-type regions with a first-type+ region and a second-type+ region formed between the first and second first-type regions. The second-type+ region of the second first-type well is formed between the first-type+ region of the second first-type well and the second-type well. According to another aspect, the device is a Shockley diode. According to yet another aspect, the first-type is a P-type and the second-type is an N-type.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

According to the present invention, an electrostatic discharge (ESD) protection device, in operation, provides the functionality of a Shockley diode. One design layout for the protection device uses the proximity of twin P-type wells to an N-type well, both formed in a P-type substrate, to set a first breakdown voltage. The current density at which the device snaps back is set by a width of counter-doped shallow N+ and P+ diffusions, which are located inside the N-type well and P-type wells, and by a sheet resistance of the N-type well and the P-type wells. The breakdown voltage $BV_{ceo}$ of an internal NPN transistor is set by the spacing of an N+ shallow diffusion, which is nested inside the P-type well, to its adjacent N-type well.

Through optimization of the layout and sheet resistance variables, a protection device may be designed to be integrated into a complimentary metal-oxide semiconductor (CMOS) process and, in this manner, readily protect various device pins at voltages up to about 60 Volts or higher. In general, the layout of the device may be designed to be less sensitive by arranging P-type wells on opposite sides of a central N-type well. When self-aligned twin wells are utilized, the device does not need to be laid out as a symmetric structure.

While the discussion herein is directed to a device having an N-type well and P-type wells formed in a P-type substrate, it should be appreciated that the types of the wells and substrate may be reversed. In this case, the other regions, discussed below, would also be reversed in type. As used herein, the terms "first-type" and "second-type" refer to opposite types. For example, if the first-type is P-type, then the second-type is N-type. As is well know to those of ordinary skill in the art, an N-type semiconductor material is a semiconductor material in which the predominant charge carriers are electrons and a P-type semiconductor material is a semiconductor material in which the predominant charge carriers are holes (positive charges). As used herein a + sign indicates very heavy doping approaching the solid solubility limit. For example, an N-type+ region is an N-type region where the doping approaches the solid solubility region.

Figure 1:
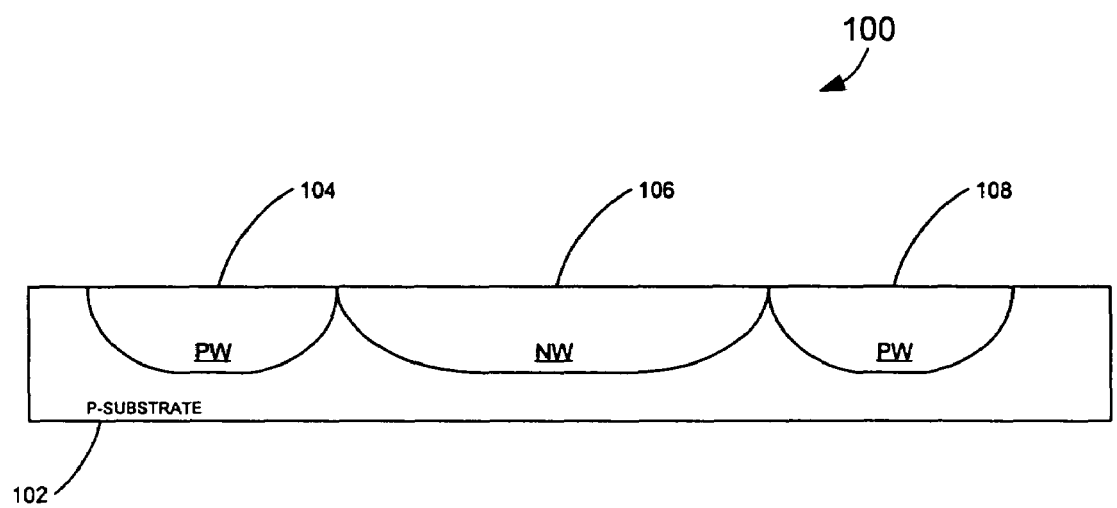
FIG. 1 is a cross-sectional view of a relevant portion of a protection device, constructed according to one embodiment of the present invention, that includes a P-type substrate with an N-type well positioned between a pair of P-type wells.

With reference to FIG. 1, a portion of a protection device 100 is depicted. The device 100 may be fabricated utilizing a P-type substrate 102 that includes a centrally located N-type well 106 and twin P-type wells 104 and 108 located on opposite sides of the N-type well 106. In a typical process, the P-type substrate 102 may have a (100) Miller indice. After a thermal implant screen oxide step, the N-type well 106 and the P-type wells 104 and 108 are masked and implanted into the P-type substrate 102. The wells 104, 106 and 108 are then driven into (e.g., to a depth of 4 μm) the P-type substrate 102. As is shown in FIG. 1, for a symmetric design of the device 100, a P-type well is located on opposite sides of the N-type well. It should be appreciated that, according to the present invention, the N-type well and the P-type wells can be abutted, overlapped or spaced away from one another to achieve desired characteristics for the device 100.

Figure 2:
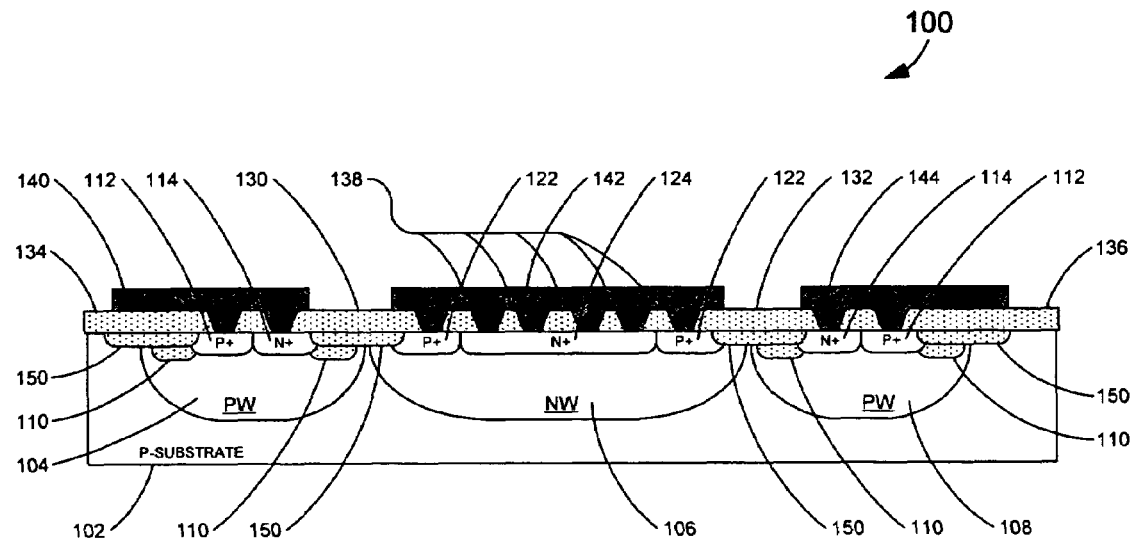
FIG. 2 is a cross-sectional view of the protection device of FIG. 1 after additional processing.

With reference to FIG. 2, the protection device 100 of FIG. 1 is depicted after a number of additional steps. That is, after implantation of the P-type wells (anode) 104 and 108 and the N-type well (cathode) 106 into the P-type substrate 102, the P-type substrate 102 is masked and shallow P-type regions (PFLD) 110 are implanted into the P-type wells 104 and 108. A field oxide 150 is then grown leaving active area regions associated with the P-type wells 104 and 108 and the N-type well 106. Shallow N+ and P+ regions are then implanted into (e.g., to a depth of 0.3 μm) the P-type wells 104 and 108 and the N-type well 106. Specifically, P+ diffusions 112 and N+ diffusions 114 are implanted into the P-type wells 104 and 108 and P+ diffusions 122 are implanted into the N-type well 106 on either side of an implanted N+ diffusion 124.

After implantation, the shallow diffusions are driven into the silicon of the P-type wells 104 and 108 and the N-type well 106. Next, a first dielectric layer is added to cover the diffusions. Then, contact holes are etched through the first dielectric layer. Next, metal runners 140, 142 and 144 are deposited and defined. As is shown in FIG. 2, the metal runner 140 contacts the P+ diffusion 112 and the N+ diffusion 114 located in the P-type well 104 and the metal runner 144 contacts the P+ diffusion 112 and the N+ diffusion 114 located in the P-type well 108. As the P-type wells 104 and 108 act as an anode of the device 100, the metal runners 140 and 142 are interconnected. An oxide layer 134 electrically isolates the runner 140 from an adjacent runner. The metal runner 142 contacts the P+ regions 122 and the N+ region 124 located in the N-type well 106. As is shown, oxide layers 130 and 132 isolate the runner 142 from adjacent runners 140 and 144. It should be appreciated that the device 100 shown in FIG. 2 is a relatively non-complex device and that more dielectric and metal layers may be added to the device 100 to achieve a desired connectivity.

Figure 3:
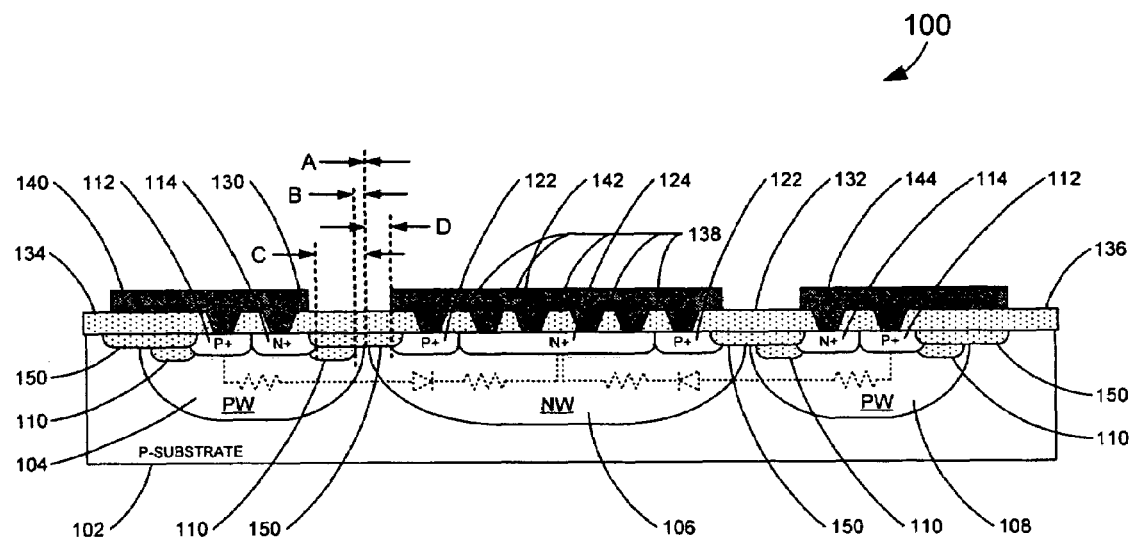
FIG. 3 is a cross-sectional view of the protection device of FIG. 2 with various design parameters illustrated.
Figure 6A:
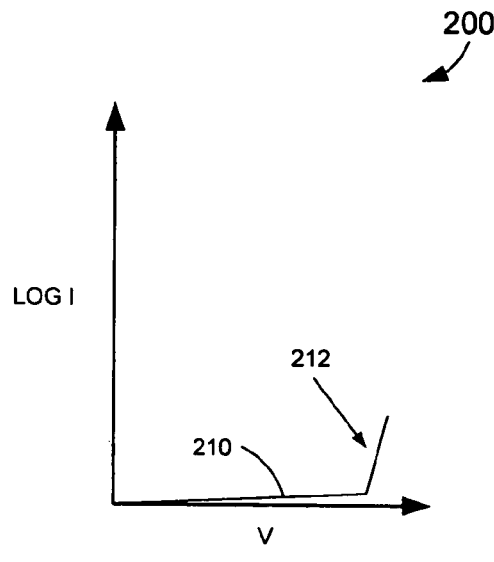
FIG. 6A is a graph that includes a curve that plots the voltage-current relationship of the device of FIG. 2 for a first breakdown point.

With reference to FIGS. 3 and 6A, the metal runner 142 is electrically coupled to a cathode of the device 100 and is also connected to an output circuit pad, along with other circuit elements that are to be protected from ESD stress. During normal operation, the cathode remains off, due to the high breakdown voltage of the N-type well 106 to P-type wells 104 and 108 and N-type well 106 to P-type substrate 102. When an ESD transient is present at the protected device pin, the voltage on the cathode exceeds the breakdown voltage of the N-type well 106 to P-type wells 104 and 108. As such, current flows from the N+ diffusion 124 and the N-type well 106 into the P+ 112 diffusion and the P-type wells 104 and 108. As is shown in FIG. 6A, a graph 200 includes a curve 210 that plots the voltage of the device 100 with respect to the logarithmic current through the device (illustrated diode) 100. As is shown, a first breakdown voltage is reached at a first breakdown 212 on curve 210.

The spacing 'A' between the N-type well 106 and the P-type well 104 and the spacing 'B', which is the width of the P-type well 104 overlap of PFLD implant 110, combine to set the first breakdown voltage. It should be appreciated that the spacing 'C', which is the width of the P-type well 104 enclosure of the N+ diffusion 114, and the total doping concentration of the P-type well 104 under the N+ diffusion 114 is required to be sufficient to prevent N+ punch-through and early breakdown. Additionally, it should be appreciated that the spacing 'D', which is the width of the N-type well 106 enclosure of the P+ diffusion 122, and the total doping concentration of the N-type well 106 under the P+ diffusion 112 is required to be sufficient to prevent P+ punch-through and early breakdown. It is also desirable that the metal from the anode and cathode of the device 100 do not overlap the point at which the N-type well 106 and P-type well 104 meet in order to have no influence on the level of the first breakdown voltage.

Figure 4:
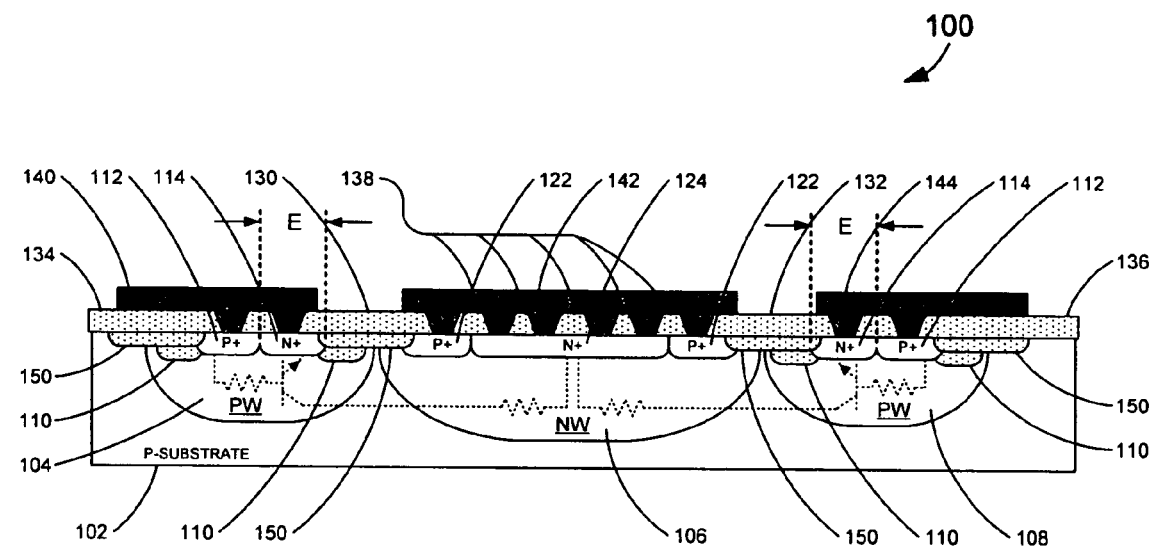
FIG. 4 depicts the protection device of FIG. 2 with an additional design parameter illustrated.
Figure 6B:
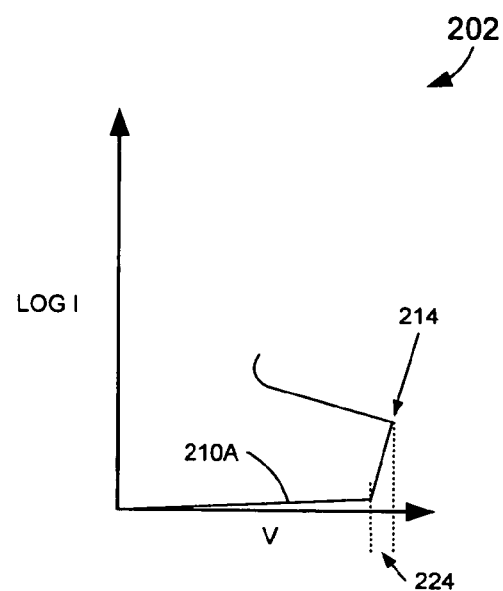
FIG. 6B depicts a graph that includes a curve that plots the voltage-current relationship of the device of FIG. 2 for a first and second breakdown point.

With reference to FIGS. 4 and 6B, a width 'E' of the N+ diffusion 114 multiplied by the sheet resistance of the P-type well 104, under the N+ diffusion 114, sets the critical current density required to trigger a second breakdown 214, as shown by curve 210A. Increasing the width the N+ diffusion 114 and the sheet resistance of the P-type well 104 causes the breakdown of the device 100 to occur at lower voltage and current levels, as the base-emitter voltage required to turn on the illustrated NPN transistor develops at a lower overall current density. In general, it is desirable for the second breakdown to occur at a lower voltage as the extra voltage (delta V 224) added to the first breakdown voltage continues to approach a breakdown voltage of the protected device.

In the event that the P-type well 104 has a very low sheet resistance and the N+ diffusion 114 width is small, delta V 224 may become large enough to cause the breakdown voltage of the protection device 100 to exceed the breakdown voltage of the protected device. As is shown, the second breakdown 214 occurs at a second breakdown voltage that is greater in magnitude than the first breakdown voltage.

Figure 5:
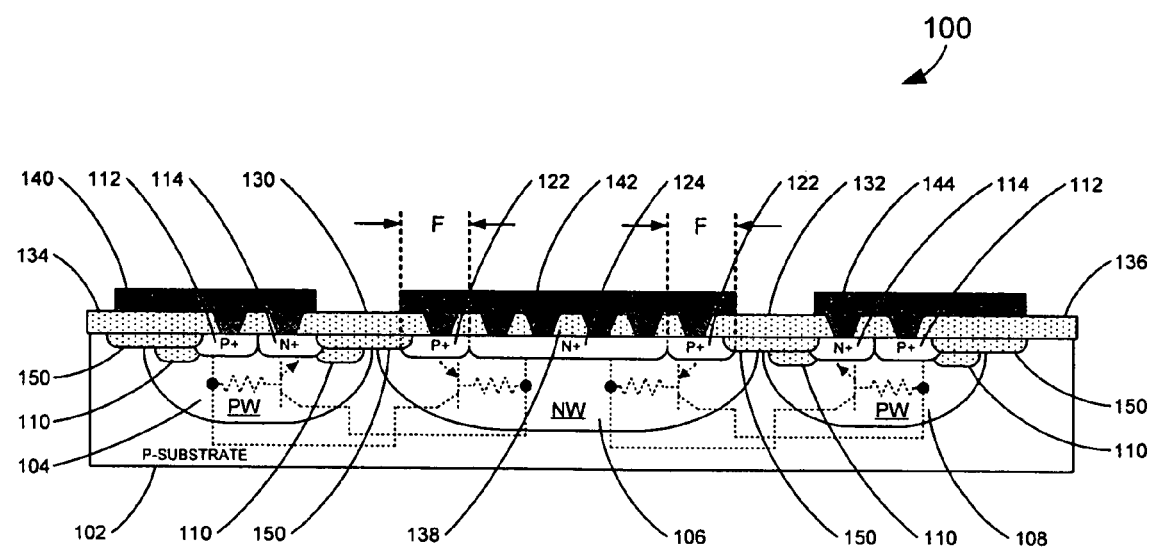
FIG. 5 depicts the protection device of FIG. 2 with another additional design parameter illustrated.
Figure 6C:
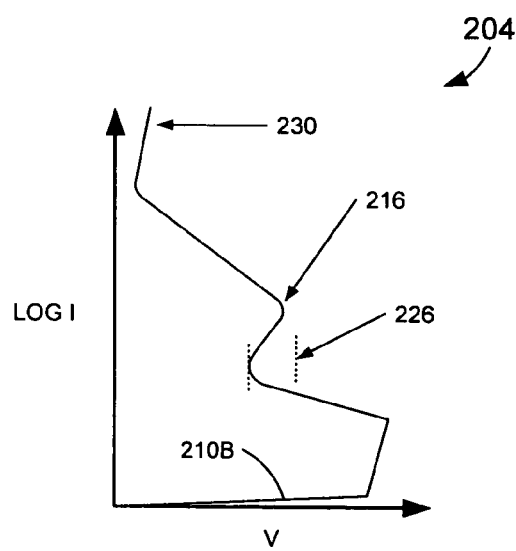
FIG. 6C depicts a graph that includes a curve that plots the voltage-current relationship of the device of FIG. 2 for a first, second and third breakdown point.

With reference to FIGS. 5 and 6C, a width 'F' of the P+ diffusion 122 multiplied by the sheet resistance of the N-type well 106, under the P+ diffusion 122, sets the critical current density required to trigger a third breakdown 216, as shown on curve 210B. Increasing the width of the P+ diffusion 122 and the sheet resistance of the N-type well 106 causes the third breakdown 216 of the device 100 to occur at a lower voltage level, as the base-emitter voltage required to turn on the illustrated PNP transistor develops at a lower overall current density. It is generally desirable for the third breakdown 216 to occur at a lower voltage level as the extra voltage (delta V 226) added to the second breakdown voltage forces more power through the protected device, reducing the ESD ruggedness of the protected device. The peak ESD protection power that can be achieved is directly related to the design of the parameter 'F' and the sheet resistance of the N-type well 106. At point 230 on the curve 210B, the device 100 exhibits a relatively low on-resistance.

An exemplary protection device may be constructed with the parameters A-F having the following values: A of about 0 µm; B of about 0.6 µm; C of about 4 µm; D of about 4 µm; E of about 8 µm; and F of about 8 µm.

Accordingly a protection device has been described herein that can be readily integrated with a semiconductor device that is to be protected from electrostatic discharge. This is particularly advantageous in an automotive environment due to increased usage of electronic components in motor vehicles.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. An electrostatic discharge (ESD) protection device, comprising:
    a first-type substrate;
    a second-type well formed in the substrate, wherein the second-type well includes a second-type+ region formed between a first and second first-type+ region; and
    a first first-type well formed in the substrate adjacent a first side of the second-type well, wherein the first first-type well includes a first first-type region and a second first-type region with a first-type+ region and a second-type+ region formed between the first and second first-type regions, and wherein the second-type+ region of the first first-type well is formed between the first-type+ region of the first first-type well and the second-type well.

2. The device of claim 1, wherein the second-type well and the first first-type well are one of abutted, overlapped and spaced apart from one another.

3. The device of claim 1, further comprising:
    a second first-type well formed in the substrate adjacent a second side of the second-type well, wherein the second first-type well includes a first and second first-type region with a first-type+ region and a second-type+ region formed between the first and second first-type regions, and wherein the second-type+ region of the second first-type well is formed between the first-type+ region of the second first-type well and the second-type well.

4. The device of claim 1, wherein the device is a Shockley diode.

5. The device of claim 1, wherein the first-type is a P-type and the second-type is an N-type.

6. An electrostatic discharge (ESD) protection device, comprising:
    a P-type substrate;
    an N-type well formed in the substrate, wherein the N-type well includes an N+ region formed between a first P+ region and a second P+ region; and
    a first P-type well formed in the substrate adjacent a first side of the N-type well, wherein the first P-type well includes a first P-type region and a second P-type region with a P+ region and an N+ region formed between the first and second P-type regions, and wherein the N+ region of the first P-type well is formed between the P+ region of the first P-type well and the N-type well.

7. The device of claim 6, wherein the N-type well and the first P-type well are one of abutted, overlapped and spaced apart from one another.

8. The device of claim 6, further comprising:
    a second P-type well formed in the substrate adjacent a second side of the N-type well, wherein the second P-type well includes a first P-type region and a second P-type region with a P+ region and an N+ region formed between the first and second P-type regions, and wherein the N+ region of the second P-type well is formed between the P+ region of the second P-type well and the N-type well.

9. The device of claim 6, wherein the device functions as a Shockley diode.

10. An electrostatic discharge (ESD) protection device, comprising:
    a first-type substrate;
    a second-type well formed in the substrate, wherein the second-type well includes a second-type+ region formed between a first and second first-type+ region;
    a first first-type well formed in the substrate adjacent a first side of the second-type well, wherein the first first-type well includes a first first-type region and a second first-type region with a first-type+ region and a second-type+ region formed between the first and second first-type regions, and wherein the second-type+ region of the first first-type well is formed between the first-type+ region of the first first-type well and the second-type well; and
    a second first-type well formed in the substrate adjacent a second side of the second-type well, wherein the second first-type well includes a first and second first-type region with a first-type+ region and a second-type+ region formed between the first and second first-type regions, and wherein the second-type+ region of the second first-type well is formed between the first-type+ region of the second first-type well and the second-type well.

11. The device of claim 10, wherein the second-type well and the first first-type well are one of abutted, overlapped and spaced apart from one another.

12. The device of claim 10, wherein the second-type well and the second first-type well are one of abutted, overlapped and spaced apart from one another.

13. The device of claim 10, wherein the device is a Shockley diode.

14. The device of claim 10, wherein the first-type is a P-type and the second-type is an N-type.

* * * * *